Figure 3:
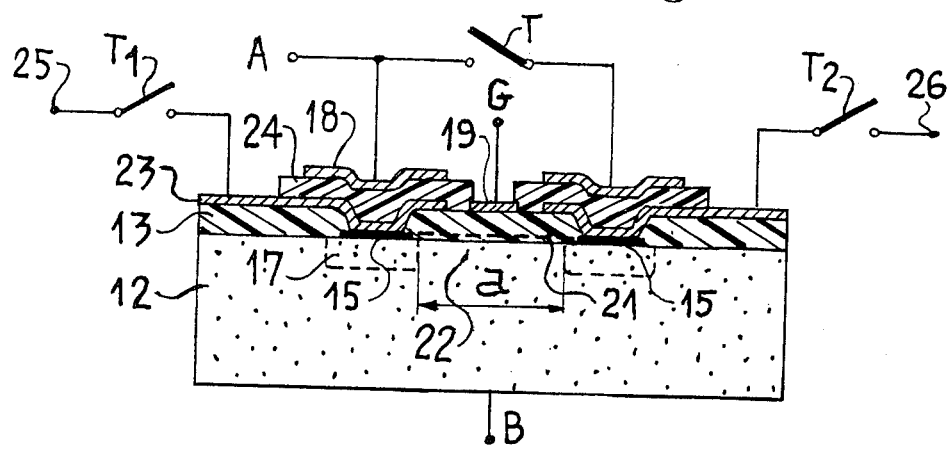

United States Patent [19]

Bert et al.

[11] 4,122,543

[45] Oct. 24, 1978

[54] NON-VOLATILE MEMORY FOR FAST SIGNALS

[75] Inventors: Alain Bert; Gérard Kantorowicz, both of Paris, France

[73] Assignee: Thomson-CSF, Paris, France

[21] Appl. No.: 835,009

[22] Filed: Sep. 20, 1977

[30] Foreign Application Priority Data

Sep. 24, 1976 [FR] France .................. 76 28766

[51] Int. Cl.$^2$ ............................................ G11C 11/40
[52] U.S. Cl. .................................. 365/182; 365/180; 365/177; 307/238
[58] Field of Search ............... 307/238; 365/174, 177, 365/180, 182, 184

[56] References Cited

U.S. PATENT DOCUMENTS 3,729,719  4/1973  Weidmann .................. 365/180

Primary Examiner—Terrell W. Fears
Attorney, Agent, or Firm—Roland Plottel

[57] ABSTRACT

A memory for non-volatile recording, lasting a long time, of fast signals. It comprises two storage stages:

the first stage enables the input signal to be recorded by the production of depletion zones in a semiconductor;

the second stage is formed by an MIS type element whose charge is controlled by the extent of the preceding depletion zone, and ensures long recording of the signal.

19 Claims, 10 Drawing Figures

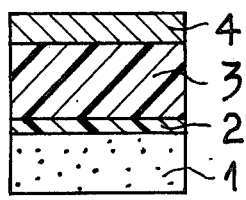
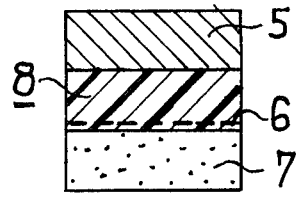
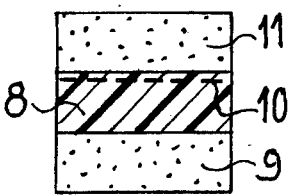
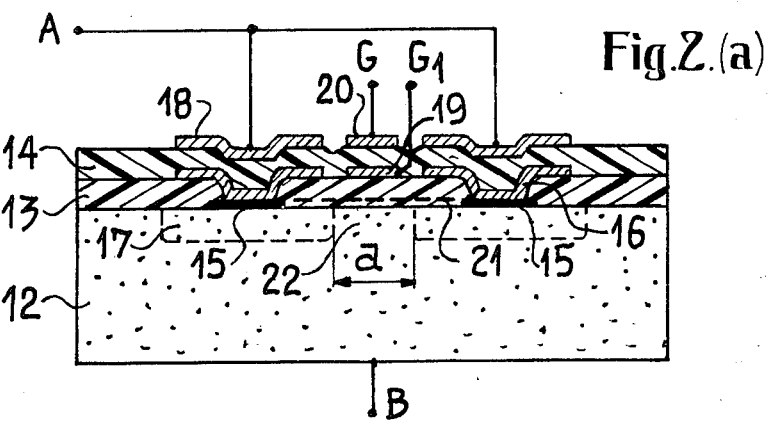
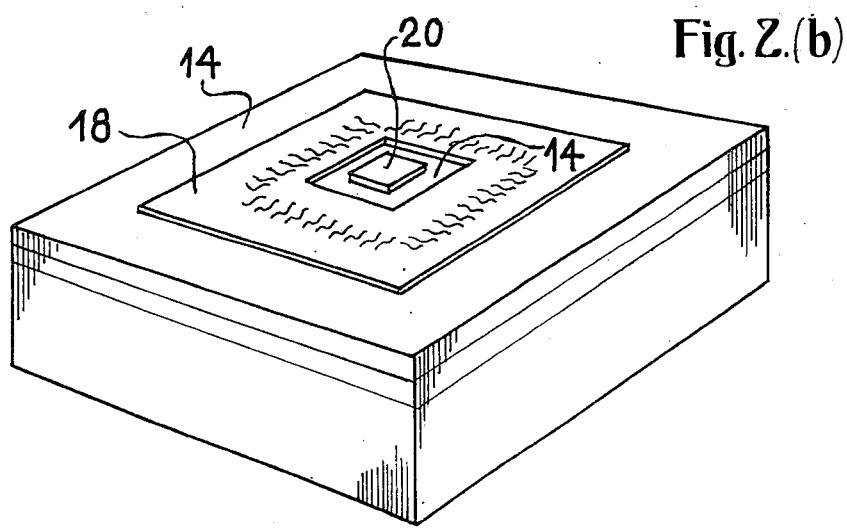

NON-VOLATILE MEMORY FOR FAST SIGNALS

The present invention covers a solid state device for the recording of a fast electric signal, the recording being non-volatile and lasting a long time.

In certain applications, it is necessary to have memories which, on the one hand, enable data to be retained for a very long time (several months for example) and, on the other, have a recording time sufficiently short to allow fast signals to be recorded. Finally, it is preferable that such a memory be non-volatile, i.e. that it retain its contents when the power supply is cut off.

Known solid state memories, which are non-volatile and last a long time, among which may be cited in particular MNOS type structures (Metal - Nitride - Oxide - Semiconductor), are not generally very useful for fast signals — of the order of a nanosecond for example — because their recording times are too long.

The present invention covers a device enabling this restriction to be avoided by obtaining recording in two phases.

According to the invention, there is provided a non-volatile memory for recording a fast signal, comprising: a first storage stage comprising a semiconductor substrate on which is made at least one junction with two branches to which is applied the signal to be recorded, each of said branches producing in the substrate a depletion zone, the two depletion zones thus produced providing a channel between them, the width of said channel being a function of said signal; a second storage stage comprising an MIIS type element whose electric charge is controlled by the width of said channel, said electric charge being stored by the MIIS element and representing said signal.

Figure 4A:
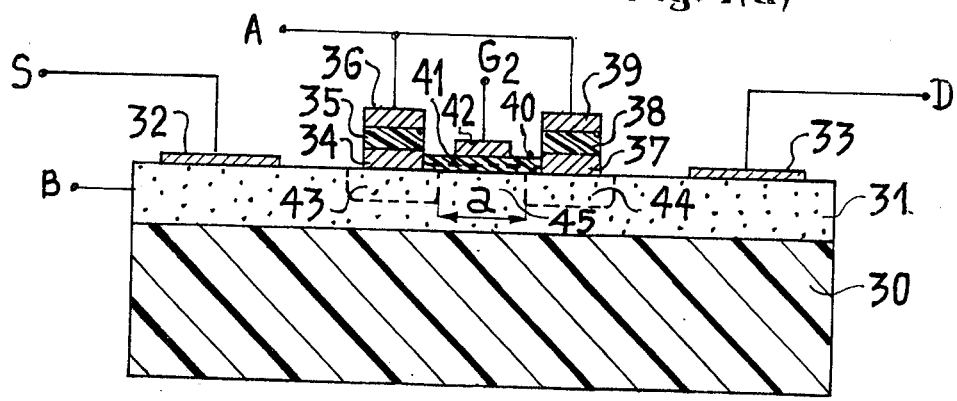
Figure 4B:
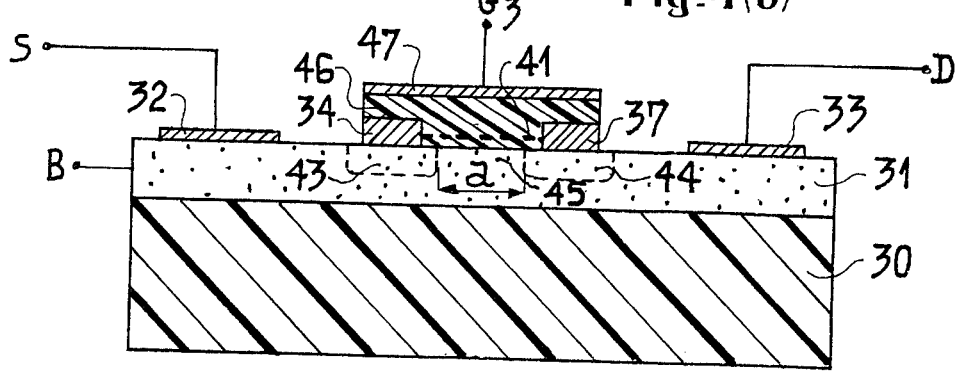
Figure 5:
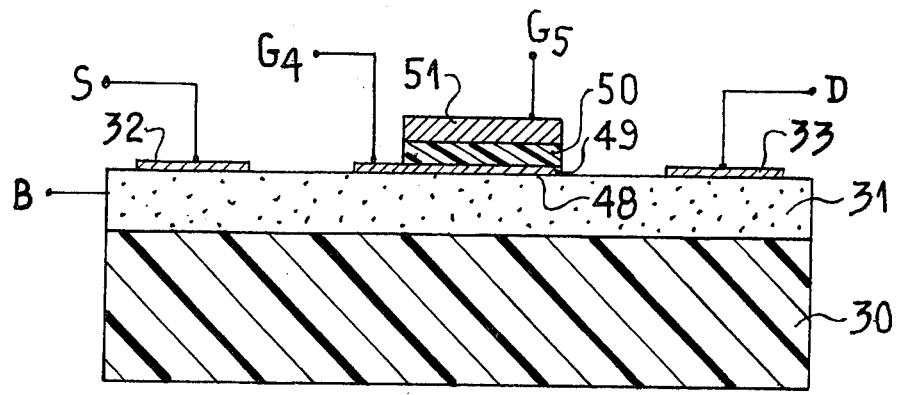
Figure 6B:
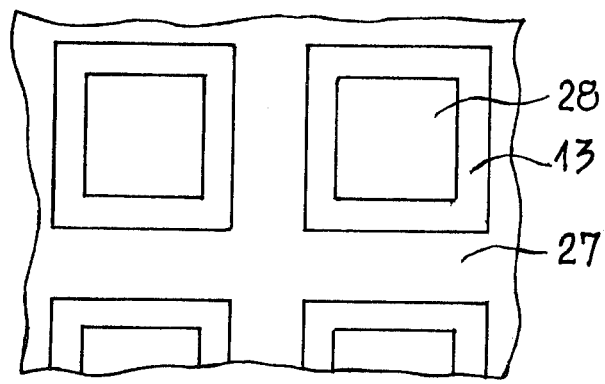
Figure 6A:
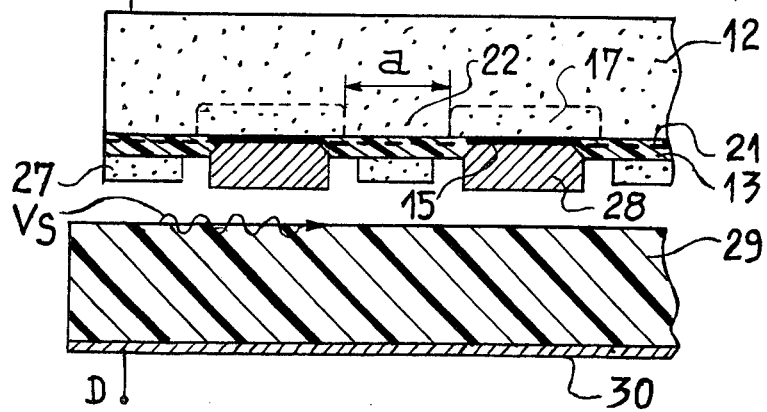

The invention will be better understood with the help of the following description, illustrated by the drawings attached which show:

in FIGS. 1a, 1b and 1c, ways of producing the MIIS element used in device in accordance with the invention;

in FIGS. 2a and 2b, a first embodiment of the device in accordance with the invention;

in FIG. 3, a variant embodiment of the device in FIG. 2;

in FIGS. 4a and 4b, a second embodiment of the device in accordance with the invention;

in FIG. 5, a third embodiment of the device in accordance with the invention;

in FIGS. 6a and 6b, a fourth embodiment of the device in accordance with the invention, which uses elastic surface waves.

On these various figures, the same reference concern the same elements.

FIGS. 1a, 1b and 1c show ways of producing an MIIS element.

It may be remembered that an MIIS structure is formed by a layer of metal covered by a first layer of insulator, itself covered by a very thin layer of insulator (the thickness being a few tens of Angströms) and finally by a semiconductor layer.

In FIG. 1a is shown a silicon substrate 1 covered with a thin layer of oxide 2 on which is deposited a layer of silicon nitride 3, forming the first insulating layer, and then a layer of metal 4. A structure is thus obtained which is a special case of an MIIS, known under the initials MNOS i.e. Metal - Nitride - Oxide - Semiconductor.

Another method is shown in FIG. 1b. A silicon substrate 7 is covered with a thick layer 8 of silicon oxide in which is produced, e.g. by ion implantation, an area 6 of traps for charge carriers to a depth controlled by the energy of the ions implanted, and such that the oxide thickness between area 6 and the silicon 7 is small. Oxide 8 is then covered with a metallic layer 5. The silicon 7 may be, for example, of polycrystalline silicon doped with type P impurities.

A third method is shown in FIG. 1c. It consists in oxidizing (layer 8) a highly doped silicon substrate 9 and then in implanting low energy ions, which produce an area 10 of traps for charge carriers near the surface of oxide 8. A semiconductor layer 11 is then deposited, type P polycrystalline silicon for example. The silicon 9 here plays the part of the metallic layers (4 and 5) in the preceding figures.

As far as the operation of an MIIS structure is concerned, it may be remembered that, when a positive voltage is applied to the metal with respect to the semiconductor, electrons from the semiconductor pass through the thinnest insulating layer by a tunnel effect and are trapped either at the interface of the two insulating layers (the case in FIG. 1a) or in the ion implant area (the case in FIGS. 1b and 1c). The recording thus made can be retained for a very long time, of the order of a year. Erasure can be obtained, for example, by applying a voltage in the opposite direction.

The device shown in section in FIG. 2a consists of, from the bottom of the figure:

a semiconductor substrate 12, of type N silicon for example, whose lower surface forms an electrical connection point B.

a first insulating layer 13, of silicon oxide for example, covering the upper surface of substrate 12, except in areas covered with a metallizing surface 15, that forms with substrate 12 a Schottky type junction and hence a potential barrier at the interface. Between the junctions 15 is made an area 21 which forms a charge carrier trap area as described, for example, in FIGS. 1b and 1c. Two junctions like junction 15 are shown in FIG. 2a and they may be either independent from one another or connected together to form a square as shown in FIG. 2b for example.

electrodes 16, each covering one junction 15 and the neighbouring insulator 13.

an electrode 19, placed on insulator 13 between two electrodes 16 and not in electrical contact with them. Electrode 19 forms a connection point $G_1$ on the one hand and an MIIS element with insulator 13, area 21 and semiconductor 12 on the other.

a second insulating layer 14 covering the whole surface of the device.

electrodes 18, each placed on insulator 14 above each electrode 16, forming a connection point A.

an electrode 20 placed on insulator 14 above the electrode 19, which is not in contact with electrodes 20, the latter forming a connection point G.

FIG. 2b shows from above a possible layout of the various electrodes. Electrode 20, of roughly square shape, can be found in the centre and electrode 18 surrounds it. Insulating layer 14 appears between electrodes 18 and 20 and at the edge of electrode 18.

In operation, the signal $V_s$ to be recorded is applied between A and B. If its polarity is suitable, it causes a flow of electric charges on electrodes 16 of the Schottky diodes which, when signal $V_s$ is removed, stay stored momentarily and polarize the diodes in the reverse direction, thus creating a depletion zone, or space charge area, 17, in semiconductor 12 under the junction. The dimension of the depletion zone 17 is bigger when the charges stored are more numerous and hence when the amplitude of the signal $V_s$ is bigger. Between two junctions 15 which have been subjected to the same signal $V_s$, there remains a channel 22 whose width $a$ is a function of signal $V_s$. This forms the first phase of the recording.

The second phase is obtained by the application of a potential difference $V_e$ between G and B, with $V_G$ at point G greater than $V_B$ at point B if substrate 12 is of type N silicon. A current then appears carrying charges into trap area 21 where they are stored. This occurs in a quantity which depends on the width $a$ of channel 22 and hence of the amplitude of signal $V_s$.

Reading is obtained between the substrate (point B) and the floating electrode 19 (point $G_1$), which is only used for reading, by using a MOSFET type transistor for example whose grid is connected to $G_1$.

In a variant of operation of this device, a binary action may be obtained in which:

for a zero signal $V_s$, the depletion zones 17 are very small and many charges are recorded in area 21;

for a signal $V_s$ which is not zero, the depletion zones 17 overlap, i.e. $a = 0$, and no charge passes from the silicon to trap area 21. This may be obtained by the choice of the amplitude of signal $V_s$ as a function of the position of diodes 15.

FIG. 3 shows a variant embodiment of the device in FIG. 2 in which the MOSFET transistor used for reading is integrated in the device.

On this figure can be seen:

the semiconductor substrate 12;

the insulating layer 13, covering substrate 12 except on parts 15, which are metallized parts to form Schottky junctions;

an electrode 23 covering each junction 15 but extended to form connections, 25 and 26 respectively on each side of the device;

a single electrode 19 deposited on layer 13 between two junctions 15, forming connection G; the MIIS element is as before formed by elements 12, 21, 13 and 19;

an insulating layer 24 covering electrodes 23 above junctions 15;

the electrodes 18 deposited on insulator 24 above junctions 15, forming connection point A;

switches T, $T_1$ and $T_2$ placed respectively on connections A, 25 and 26.

It may be noted that, in this case, junctions 15 must not be joined together.

The recording process, in its two phases, is obtained as before, switches $T_1$ and $T_2$ being open and switch T closed.

For reading, Schottky diodes 15, which are used for temporary storage of charges during the first phase, also act as source and drain for a MOSFET transistor, whose grid is formed by electrode 19. Reading is obtained between the source and drain of this transistor through electrodes 23, with switches $T_1$ and $T_2$ closed and switch T open. It is realized by measurement of the conduction between the diodes, the said conduction being a function of the quantity of charges stored in area 21. Grid G may be polarized.

FIG. 4a shows a second embodiment of the device in accordance with the invention, and FIG. 4b a variant of the preceding.

The device in FIG. 4a is formed by a substrate 30, which is either insulating or semi-insulating, such as gallium arsenide, covered with a thin, active, semiconductor layer 31, which may be gallium arsenide obtained by epitaxy on the preceding substrate. Layer 31 forms a connection point B. It is covered at its ends by two electrodes 32 and 33 which form respectively the source (S) and drain (D) of a field effect transistor, whose grid is formed by an assembly of elements 34 to 42.

The complex grid of this transistor comprises two metallic layers 34 and 37 which form Schottky junctions with semiconductor 31. They are separated by an insulating layer 40. Each of the electrodes 34 and 37 is covered in succession with an insulating layer (35 and 38 respectively) and an electrode (36 and 39 respectively). Electrodes 36 and 39 are joined to the same connection point A. Insulating layer 40 contains, near semiconductor 31, an area 41 of traps for charge carriers. It is covered with an electrode 42 (connection point $G_2$) which is not in electrical contact with the preceding electrodes. The assembly 31, 41, 40 and 42 forms an MIIS structure.

Electrodes 34 and 37 need not be in electrical contact one with the other or, in a way similar to that shown in FIG. 2b, may be joined together to form a square. It is the same thing for the layers 35, 36, 38 and 39 which cover them.

The two writing phases are analogous to those previously described, i.e. signal $V_s$ is applied between A and B. After this signal is cut off, depletion zones 43 and 44 (under electrodes 34 and 37 respectively) are produced, which fix the width $a$ of the remaining conducting channel 45. During the second phase of recording, a voltage $V_e$ is applied between $G_2$ and B to transfer to area 41 a quantity of charges which is a function of the width $a$ and hence of signal $V_s$.

Reading of the data thus stored is obtained by measurement of the conduction between source (S) and drain (D) of the transistor, the conducting channel of this transistor then being localized near the interface 30–31 and its width being a function of the quantity of charges stored in area 41.

FIG. 4b shows a variant embodiment of the preceding figure, which is simplified at the level of the field effect transistor grid.

The grid is now formed by the two Schottky junctions 34 and 37, which are separated by an insulating layer 46 that covers them. An electrode 47 is deposited on insulator 46 (connection point $G_3$). Insulating layer 46 contains an area 41 of traps for charge carriers, placed near semiconductor layer 31, between electrodes 34 and 37.

This layout amounts to joining connections A and $G_2$ of the preceding figure in a single connection $G_3$ on which signal $V_s$ is supplied, followed by write voltage $V_e$ of the second phase and, possibly, a grid polarizing voltage for reading.

FIG. 5 shows a third embodiment of the memory in accordance with the invention, which operates in a bistable regime.

On this figure can be seen insulating or semi-insulating substrate 30, which is covered with an active semiconductor layer 31 at whose ends are placed electrodes 32 and 33, forming the source (S) and drain (D) of a field effect transistor.

In this embodiment, the grid of this transistor is formed by a metallic layer 49 to produce with semiconductor 31 a Schottky junction (connection point G$_4$). An insulating layer 50 covers layer 49 in part and an electrode 51 covers insulating layer 50 and forms connection point G$_5$.

It is known that it is possible to obtain bistable operation with a Schottky grid field effect transistor. The switch from the first conducting state of the transistor to the second, and vice versa, is obtained by the application to the grid of a signal whose amplitude exceeds a certain threshold. Such an operation is described in particular in "Applied Physics Letters", volume 25, No. 9, dated Nov. 1, 1974, in an article entitled "Bistable switching on gallium arsenide Schottky gate field effect transistors" (pages 510 et seq.). This effect is related to the existence of traps at the interface 48 between the metal 49 and semiconductor layer 31, the traps being produced when the Schottky junction is produced.

The first recording phase occurs when signal V$_s$ is applied between grid G$_5$ and source S or point B. When signal V$_s$ has gone, the Schottky diode is negatively polarized and the transistor grid is then polarized to a value which must be higher than the threshold mentioned above, to cause a change of state in the transistor during the second phase. When signal V$_s$ is zero, the change of state does not occur.

In the case in which the signal V$_s$ to be recorded is a small signal, it is possible to add polarizing to it or to apply an additional write signal to electrode G$_5$ during the second phase.

Reading is obtained by detection of the conduction in semiconductor 31 between source (S) and drain (D).

Erasure is obtained by passing an adequate current through the grid, thanks to electrode G$_4$.

FIGS. 6a and 6b show another way of producing a device in accordance with the invention, which allows recording of a signal carried by elastic surface waves.

It comprises:

a piezoelectric substrate 29 on whose surface trains of elastic waves V$_s$, which represent the data to be recorded, can propagate;

a flat electrode 30 covering the lower surface of substrate 29 if the elastic waves move over the upper surface, and which forms a connection point D;

a semiconductor substrate 12, of type N silicon for example, placed opposite the upper surface of substrate 29 but not in contact with it, forming a connection point C.

The lower surface of substrate 12 is covered with an insulating layer 13, of silicon oxide for example, which leaves free an array of areas, each covered with a metallic layer 15 to form Schottky junctions with substrate 12. Metallic layers 15 are covered with metallic plates 28 which do not overlap on insulating layer 13. Between plates 28 and not in contact with them, a grid 27 formed of polycrystalline silicon is placed. Finally, as before, an area 21 of traps for charge carriers is made in insulating layer 13 and placed near the surface of substrate 12 to give MIIS structures, formed by substrate 12, insulating layer 13, area 21 and grid 27.

FIG. 6b shows a view from above of the lower surface of substrate 12 in which can be seen the metallic plates 28, of square shape for example, surrounded by grid 27 but separated from it by insulating layer 13.

In operation, during the first phase of recording, a write pulse is applied between points C and D and the presence of elastic wave V$_s$ causes the storage in each Schottky diode of a quantity of charges, which is a function of the electric field associated with the wave, and then the production of a depletion zone 17 under each diode, whose extent depends on signal V$_s$. Depletion zones 17 leave between them a channel 22 whose width $a$ is then a function of V$_s$.

During the second phase of recording, a voltage V$_e$ is applied to grid 27, this voltage being positive in the example chosen, in order to cause the charge carriers (here electrons) to move from substrate 12 towards trap area 21 where they are stored in a quantity which is a function of the width of channel 22 and hence of signal V$_s$.

It may be noted that the resistivity of grid 27 must be high enough not to affect the propagation of the acoustic wave, but sufficiently low for the time taken to set up a potential difference between said grid 27 and the base of semiconductor 12 to be small compared with the charge recording time in the diodes.

Reading is obtained between points C and D as follows: a second elastic wave, called the read wave, is passed to the surface of substrate 29 which induces between C and D an electromotive force whose amplitude is a function of the number of charges stored.

Erasure is obtained by applying a reverse voltage (negative in this case) to grid 27.

What is claimed is:

1. A non-volatile memory for recording a fast signal, comprising:

a first storage stage comprising a semiconductor substrate on which is made at least one junction with two branches, to which is applied the signal to be recorded, each of said branches producing in the substrate a depletion zone, the two depletion zones thus produced providing a channel between them, the width of said channel being a function of said signal;

a second storage stage comprising an MIIS type element whose electric charge is controlled by the width of said channel, said electric charge being stored by the MIIS elements and representing said signal.

2. A memory as claimed in claim 1, wherein said junction is of the Schottky type.

3. A memory as claimed in claim 2, wherein said semiconductor substrate is covered with a first insulating layer except in at least two areas of said substrate which are each covered by a metallic layer, both forming the two branches of said junction, said first insulating layer comprising, between said two branches and near said substrate, an area of traps for charge carriers and being covered with a first electrode above said trap area, said first insulating layer and said first electrode being covered with a second insulating layer, the latter being covered by at least a second and a third electrode respectively above said two branches of the junction, and a fourth electrode above said first electrode; said signal being applied between said second and third electrodes interconnected on the one hand, and said substrate on the other; said MIIS element being formed by said substrate, said first insulating layer, said trap area and said first electrode, said charging of the MIIS element being carried out by the application of a potential difference between said substrate and said fourth electrode; the output read signal being picked up on said first electrode.

4. A memory as claimed in claim 2, wherein said semiconductor substrate is covered with a first insulating layer except in at least two areas of said substrate which are each covered with a metallic layer, both forming the two branches of said junction, said first insulating layer comprising, between said two branches and near said substrate, an area of traps for charge carriers and being covered with a first electrode above said trap area, said metallic layers being covered with a second insulating layer, the latter being covered with at least a second and a third electrodes respectively above said two branches of said junction; said signal being applied between on the one hand, said second and third electrodes and on the other hand, said substrate; said MIIS element being formed by said substrate, said first insulating layer, said trap area and said first electrode, said charging of the MIIS element being obtained by the application of a potential difference between said substrate and said first electrode, and reading being obtained by the application of a potential difference between said two branches of the junction.

5. A memory as claimed in claim 2, wherein said semicontuctor substrate is covered with a first electrode and a second electrode with no electrical contact between them, between the latters with a third electrode and a fourth electrode which form said two branches of said junction and, between said two branches, with a first insulating layer comprising, near said substrate, an area of traps for charge carriers, said third and fourth electrodes each being covered in succession with a second insulating layer and a fifth electrode, said first insulating layer being covered with a sixth electrode with no electrical contact with the other electrodes; said signal being applied between said substrate and said fifth electrode; said MIIS element being formed by said substrate, said first insulating layer, said trap area and said sixth electrode, the charging of said MIIS element being obtained by the application of a potential difference between said substrate and said sixth electrode, and reading being obtained by the application of a potential difference between said first and second electrodes.

6. A memory as claimed in claim 2, wherein said semiconductor substrate is covered with a first electrode and a second electrode with no electrical contact between them, between the latters with a third electrode and a fourth electrode, which form said two branches of said junction, and between these branches and also covering them, with an insulating layer containing near substrate an area of traps for charge carriers, said insulating layer being covered with a fifth electrode; said signal being applied between said substrate and said fifth electrode; said MIIS element being formed by said substrate, said insulating layer, said trap area and said fifth electrode, the charging of said MIIS element being obtained by the application of a potential difference between said substrate and said fifth electrode, and the reading being obtained by the application of a potential difference between said first and second electrodes.

7. A memory as claimed in claim 2, wherein said semiconductor substrate is covered with a first electrode and a second electrode with no electrical contact between them, and between the latters with a third electrode forming with the substrate a Schottky junction, said third electrode being covered in succession with an insulating layer and a fourth electrode; said signal being applied between said substrate and said fourth electrode; the reading being obtained by the application of a potential difference between said first and second electrodes.

8. A memory as claimed in claim 2, wherein said semiconductor substrate is covered with an insulating layer except in at least two areas of said substrate which are each covered with a metallic layer, both forming the two branches of said junction, said insulating layer comprising between said two branches and near said semiconductor substrate an area of traps for charge carriers, and being covered above said area with a semiconductor layer with no electrical contact with said metallic layers; said MIIS element being formed by said semiconductor substrate, said insulating layer, said trap area and said semiconductor layer; said memory further comprising a piezoelectric substrate on which elastic waves representing said signal propagate when operating, said piezoelectric substrate being placed in front of a surface of the semiconductor substrate which is opposite the one covered with said insulating layer; the reading being obtained between the opposite surfaces of the two substrates by the application of an electric read wave to the surface of the said piezoelectric substrate.

9. A memory as claimed in claim 8, wherein said metallic layers are deposited on said semiconductor substrate according to a matrix design.

10. A memory as claimed in claim 8, wherein said semiconductor substrate is made of silicon, said insulating layer of silicon and said area by ion implants in said insulating layer.

11. A memory as claimed in claim 3, wherein said substrate is formed of type N silicon, said insulating layers are formed by silicon oxide, and said charge carrier trap area is formed by an insulating layer with ion implantation therein.

12. A memory as claimed in claim 4, wherein said substrate is formed of type N silicon, said insulating layers are formed by silicon oxide, and said charge carrier trap area is formed by an insulating layer with ion implantation therein.

13. A memory as claimed in claim 5, wherein said semiconductor substrate is formed by a layer of epitaxial gallium arsenide on a semi-insulating base of gallium arsenide.

14. A memory as claimed in claim 7, wherein said semiconductor substrate is formed by a layer of epitaxial gallium arsenide on a semi-insulating base of gallium arsenide.

15. A memory as claimed in claim 3, wherein said two branches are joined together to form a quadrilateral.

16. A memory as claimed in claim 5, wherein said two branches are joined together to form a quadrilateral.

17. A memory as claimed in claim 6, wherein said two branches are joined together to form a quadrilateral.

18. A memory as claimed in claim 7, wherein said two branches are joined together to form a quadrilateral.

19. A memory as claimed in claim 8, wherein said two branches are joined together to form a quadrilateral.

* * * * *